US012120895B2

(12) United States Patent
Matsui et al.

(10) Patent No.: US 12,120,895 B2
(45) Date of Patent: Oct. 15, 2024

(54) SOLAR CELL

(71) Applicant: Panasonic Holdings Corporation, Osaka (JP)

(72) Inventors: Taisuke Matsui, Osaka (JP); Takeyuki Sekimoto, Osaka (JP); Takashi Nishihara, Osaka (JP); Teruaki Yamamoto, Osaka (JP); Ryusuke Uchida, Hyogo (JP)

(73) Assignee: PANASONIC HOLDINGS CORPORATION, Osaka (JP)

( * ) Notice: Subject to any disclaimer, the term of this patent is extended or adjusted under 35 U.S.C. 154(b) by 4 days.

(21) Appl. No.: 18/059,917

(22) Filed: Nov. 29, 2022

(65) Prior Publication Data

US 2023/0088816 A1    Mar. 23, 2023

Related U.S. Application Data

(63) Continuation of application No. PCT/JP2021/021041, filed on Jun. 2, 2021.

(30) Foreign Application Priority Data

Jun. 24, 2020 (JP) ................ 2020-109179

(51) Int. Cl.
| | | |
|---|---|---|
| H01L 51/44 | (2006.01) | |
| H01G 9/20 | (2006.01) | |
| H01L 31/0216 | (2014.01) | |
| H01L 51/42 | (2006.01) | |
| H10K 30/20 | (2023.01) | |

(Continued)

(52) U.S. Cl.
CPC ........... *H10K 30/80* (2023.02); *H01G 9/2009* (2013.01); *H10K 30/20* (2023.02); *H10K 85/30* (2023.02); *H10K 85/322* (2023.02); *H10K 85/631* (2023.02)

(58) Field of Classification Search
CPC .................................................. H01G 9/2009
See application file for complete search history.

(56) References Cited

U.S. PATENT DOCUMENTS

2016/0380125 A1\*  12/2016  Snaith ............... H01L 31/02167
                                                                   136/256
2021/0119127 A1     4/2021  Wakamiya et al.

FOREIGN PATENT DOCUMENTS

| CN | 111223990 | 6/2020 |
|---|---|---|
| JP | 2014-220248 | 11/2014 |
| WO | 2019/182058 | 9/2019 |

OTHER PUBLICATIONS

Liu et al., Lewis-Acid Doping of Triphenylamine-Based Hole Transport Materials Improves the Performance and Stability of Perovskite Solar Cells, ACS Applied Material Interfaces, vol./issue 12, 21, pp. 23874-23884, May 5, 2020 (Year: 2020).\*

(Continued)

*Primary Examiner* — Jayne L Mershon
(74) *Attorney, Agent, or Firm* — GREENBLUM & BERNSTEIN, P.L.C.

(57) ABSTRACT

The solar cell of the present disclosure includes a first electrode, a photoelectric conversion layer, an intermediate layer, a hole transport layer, and a second electrode in this order, wherein the hole transport layer includes a hole transport material and an oxidant, the photoelectric conversion layer includes a perovskite compound containing iodine, and the intermediate layer includes at least one selected from the group consisting of bromide, chloride, and fluoride.

10 Claims, 2 Drawing Sheets

(51) Int. Cl.
  *H10K 30/80*  (2023.01)
  *H10K 85/30*  (2023.01)
  *H10K 85/60*  (2023.01)

(56) References Cited

OTHER PUBLICATIONS

The EPC Office Action dated Oct. 26, 2023 for the related European Patent Application No. 21827933.9.
Wang Yong et al: "Bifunctional Stabilization of All-Inorganic [alpha]-CsPbI3 Perovskite for 17% Efficiency Photovoltaics", Journal of the American Chemical Society, vol. 140, No. 39, Sep. 24, 2018 (Sep. 24, 2018), pp. 12345-12348, XP093092457.
Wang Yong et al: "Supporting Information: Bi-functional Stabilization of All-inorganic [alpha]-CsPbI3 Perovskite for 17% Efficiency Photovoltaics", Sep. 24, 2018 (Sep. 24, 2018), XP093092459, Retrieved from the Internet: URL: https://pubs.acs.org/doi/10.1021/jacs.8b07927, [retrieved on Oct. 17, 2023], p. S2, line 8-Line 21.
Liu Guozhen et al: "Interface passivation treatment by halogenated low-dimensional perovskites for high-performance and stable perovskite photovoltaics", Nano Energy, vol. 73, Apr. 4, 2020(Apr. 4, 2020), p. 104753, XP093092270.
Liu Guozhen et al: "Supporting Information: Interface passivation treatment by halogenated low-dimensional perovskites for high-performance and stable perovskite photovoltaics", Nano Energy, vol. 73, Apr. 4, 2020 (Apr. 4, 2020), p. 104753, XP093092361, NL, ISSN: 2211-2855, DOI:10.1016/j.nanoen.2020.104753, p. 2, line 13-p. 3 line 14.
Cha Mingyang et al: "Enhancing Perovskite Solar Cell Performance by Interface Engineering Using CH3NH3PbBr0.9I2.1 Quantum Dots", Journal of the American Chemical Society, vol. 138, No. 27, Jul. 1, 2016 (Jul. 1, 20216), pp. 8581-8587, XP93092264.
De Holanda Matheus S. et al: "In Situ 2D Perovskite Formation and the Impact of the 2D/3D Structures on Performance and Stability of Perovskite Solar Cells", Solar RRL, [Online] vol. 3, No. 9, Jul. 17, 2019 (Jul. 17, 2019), XP093092048, Retrieved from the Internet: URL:https://onlinelibrary.wiley.com/doi/full-XML/10.1002/solr.201900199> [retrieved on Oct. 17, 2023].
Song Dandan et al: "Dual function interfacial layer for highly efficient and stable lead halide perovskite solar cells", Journal of Materials Chemistry A, vol. 4, No. 16, Jan. 1, 2016 (Jna. 1, 2016), pp. 6091-6097, XP93091671.
Liu Jiang et al: "Lewis-Acid Doping of Triphenylamine-Based Hole Transport Materials Improves the Performance and Stability of Perovskite Solar Cells", Applied Materials & Interfaces, vol. 12, No. 21, May 15, 2020 (May 15, 2020), pp. 23874-23884, XP93092558.
International Search Report of PCT application No. PCT/JP2021/021041 dated Jul. 20, 2021.
Julian Burschka et al., "Sequential deposition as a route to high-performance perovskite-sensitized solar cells", Nature, vol. 499, Jul. 2013, pp. 316-319.
Jordi Carrillo et al., "Ionic Reactivity at Contacts and Aging of Methylammonium Lead Triiodide Perovskite Solar Cells", Advanced Energy Materials, 2016, 6, 1502246.
Qi Jiang et al., "Surface passivation of perovskite film for efficient solar cells", Nature Photonics, vol. 13, 2019.
Jason J. Yoo et al., "An interface stabilized perovskite solar cell with high stabilized efficiency and low voltage loss", Energy & Environmental Science, vol. 12, 2019, pp. 2192-2199.
Taisuke Matsui et al., "Compositional Engineering for Thermally Stable, Highly Efficient Perovskite Solar Cells Exceeding 20% Power Conversion Efficiency with 85 /85% 1000 h Stability", Advanced Material, vol. 31, 2019, 1806823.

\* cited by examiner

SOLAR CELL

BACKGROUND

1. Technical Field

The present invention relates to a solar cell.

2. Description of the Related Art

"Sequential deposition as a route to high-performance perovskite-sensitized solar cells", Nature, vol. 499, 18 Jul. 2013, DOI: 10.1038/nature12340 discloses a perovskite solar cell using a perovskite compound represented by $CH_3NH_3PbI_3$ as a photoelectric conversion material, $TiO_2$ as an electron transport material, and Spiro-OMETAD as a hole transport material.

SUMMARY

One non-limiting and exemplary embodiment provides a solar cell having high light durability.

In one general aspect, the techniques disclosed here feature a solar cell including a first electrode; a photoelectric conversion layer; an intermediate layer; a hole transport layer; and a second electrode in this order, wherein the hole transport layer includes a hole transport material and an oxidant, the photoelectric conversion layer includes a perovskite compound containing iodine, and the intermediate layer includes at least one selected from the group consisting of bromide, chloride, and fluoride.

The present disclosure provides a solar cell having high light durability.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTIONS

Figure 1:
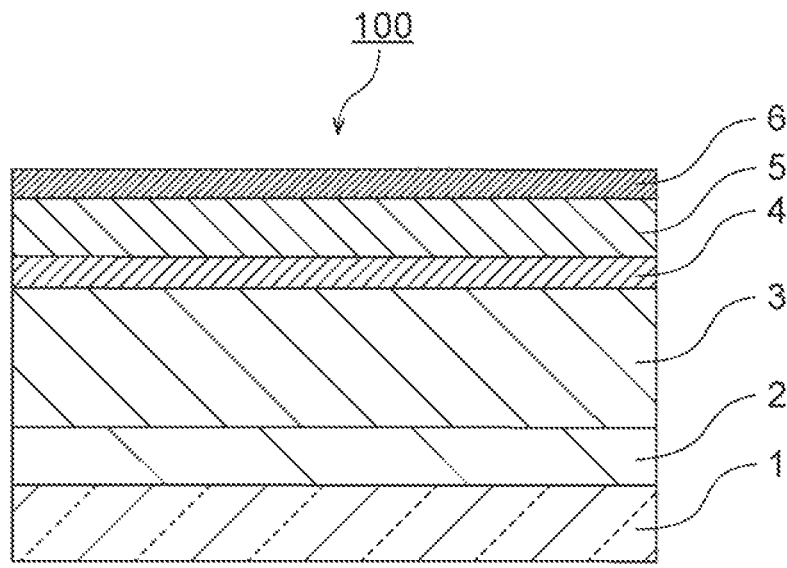
FIG. 1 shows a cross-sectional view of a solar cell according to a first embodiment.

Underlying Knowledge Forming Basis of the Present Disclosure

A perovskite solar cell uses a perovskite crystal represented by $ABX_3$ (A is a monovalent cation, B is a divalent cation, and X is a monovalent anion) or its similar structure (hereinafter, referred to as "perovskite compound") as the photoelectric conversion material. However, it has been reported that the perovskite compound has high ionic crystallinity and is prone to cause ion migration. In particular, an iodine anion constituting the X site is prone to migrate and moves to the hole transport layer side when an internal electric field occurs in the solar cell device under light irradiation. For example, "Ionic Reactivity at Contacts and Aging of Methylammonium Lead Triiodide Perovskite Solar Cells", Adv. Energy Mater., 6:1502246, DOI: 10.1002/aenm.201502246 reports that the iodine ions moved to the hole transport layer side when positive bias is applied reduce the hole transport material, 2,2',7,7'-tetrakis-(N,N-di-p-methoxyphenylamine) 9,9'-spirobifluorene (hereinafter, referred to as "Spiro-OMeTAD"). When the hole transport layer is reduced to decrease the hole concentration, hole extraction and hole-transportation ability are decreased. Consequently, the performance of the solar cell device is decreased.

In order to solve this problem, the present inventors investigated increasing the hole concentration of the hole transport material in advance and decreasing diffusion of iodine ions to holes such that the hole concentration of the hole transport layer does not significantly decrease even if migration of iodine anions occurs. In order to increase the hole concentration of the hole transport material, it is preferable to add an oxidant having a redox potential that can oxidize the hole transport material.

In the present disclosure, the term "oxidant" includes Lewis acid that can receive an electron from a hole transport material to increase the hole concentration of the hole transport material.

For example, a fluoroboron-based compound, such as tris(pentafluorophenyl) borane (hereinafter, referred to as "TPFPB") and its derivative, has a sufficiently high redox potential and therefore can increase the hole concentrations of almost all hole transport materials that match the electron level of a perovskite solar cell. It is inferred that an intermediate layer is provided between a perovskite photoelectric conversion layer and a hole transport layer for preventing the diffusion of iodine anions. In this intermediate layer, alkylammonium iodide or phenylalkylammonium iodide has been widely used for the purpose of passivation of the defects of a perovskite surface (see "Surface passivation of perovskite film for efficient solar cells", Nature Photonics, volume 13, pages 460-466 (2019) and "An interface stabilized perovskite solar cell with high stabilized efficiency and low voltage loss", Energy Environ. Sci., 2019, 12, 2192-2199). However, when these iodine-based materials are used, the fluoroboron-based compound reacts with iodine, and the hole concentration of the hole transport material cannot be sufficiently increased. Accordingly, the present inventors found that the redox reaction in the hole transport layer works as designed also during light irradiation and the light durability is highly improved by adding a fluoroboron-based compound to the hole transport layer and providing an intermediate layer containing at least one selected from the group consisting of bromide, chloride, and fluoride as a layer preventing the diffusion of iodine anions. Table 1 shows a schematic diagram of the redox reaction in the hole transport layer occurring during light irradiation when poly[bis(4-phenyl) (2,4,6-trimethylphenyl)amine] (hereinafter, referred to as "PTAA") is used as the hole transport material. Incidentally, Table 1 shows a case of using a bromide as an example of the at least one selected from the group consisting of bromide, chloride, and fluoride for the intermediate layer. As described above, it was found that an unexpected combination has an effect by focusing on the light durability and the redox potential of components, unlike the traditional concept centered on conversion efficiency.

TABLE 1

| Oxidant | None | TPFPB |
|---|---|---|
| Intermediate layer | None | None |
| Schematic diagram of redox | h+ ⤺ I/I- Penetration from perovskite layer; PTAA/PTAA+ | h+ ⤺ I/I- Penetration from perovskite layer; PTAA/PTAA+; TPFPB/TPFPB- |
| | Reduction of PTAA by iodine: bad | Iodine is oxidized instead of PTAA: bad |
| Oxidant | TPFPB | TPFPB |
| Intermediate layer | Iodine system | Bromine system |
| Schematic diagram of redox | h+ ⤺ I/I- Included in intermediate layer; PTAA/PTAA+; TPFPB/TPFPB- | h+ ⤺ PTAA/PTAA+; TPFPB/TPFPB-; Br/Br- |
| | Iodine is oxidized instead of PTAA: bad | Oxidation of PTAA by TPFPB (good) Resistant to some iodine penetration |

First Embodiment

A solar cell according to a first embodiment will now be described.

The solar cell according to the first embodiment includes:
a first electrode; a photoelectric conversion layer; an intermediate layer; a hole transport layer; and a second electrode in this order, wherein
the hole transport layer includes a hole transport material and an oxidant,
the photoelectric conversion layer includes a perovskite compound containing iodine, and
the intermediate layer includes at least one selected from the group consisting of bromide, chloride, and fluoride.

According to the configuration above, the solar cell according to the first embodiment has high light durability.

The perovskite solar cell according to the first embodiment may include a substrate. FIG. 1 shows a cross-sectional view of the solar cell according to the first embodiment.

The solar cell 100 shown in FIG. 1 includes a substrate 1, a first electrode 2, a photoelectric conversion layer 3, an intermediate layer 4, a hole transport layer 5, and a second electrode 6 in this order.

Figure 2:
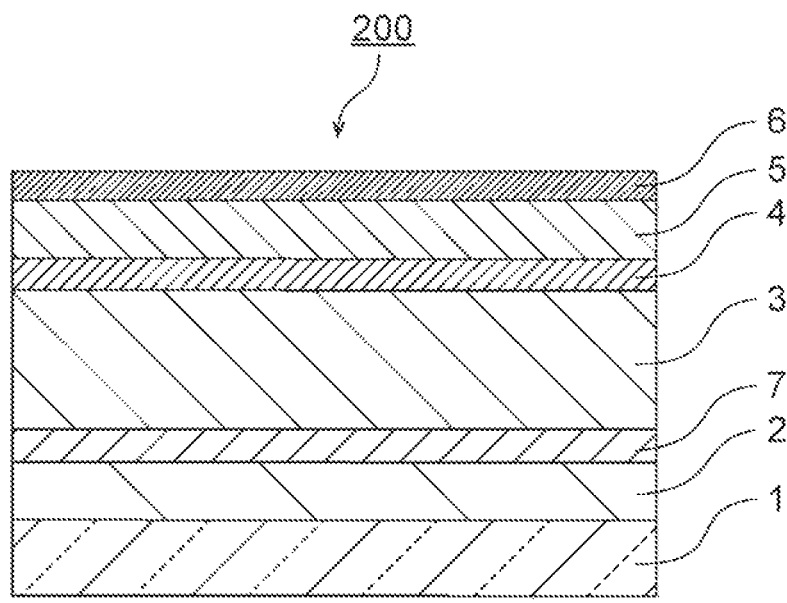
FIG. 2 shows a cross-sectional view of a modification example of the solar cell according to the first embodiment.

The perovskite solar cell of the present disclosure may include an electron transport layer between the first electrode and the photoelectric conversion layer. FIG. 2 shows a cross-sectional view of a modification example of the solar cell according to the first embodiment.

The solar cell 200 shown in FIG. 2 includes a substrate 1, a first electrode 2, an electron transport layer 7, a photoelectric conversion layer 3, an intermediate layer 4, a hole transport layer 5, and a second electrode 6 in this order.

Figure 3:
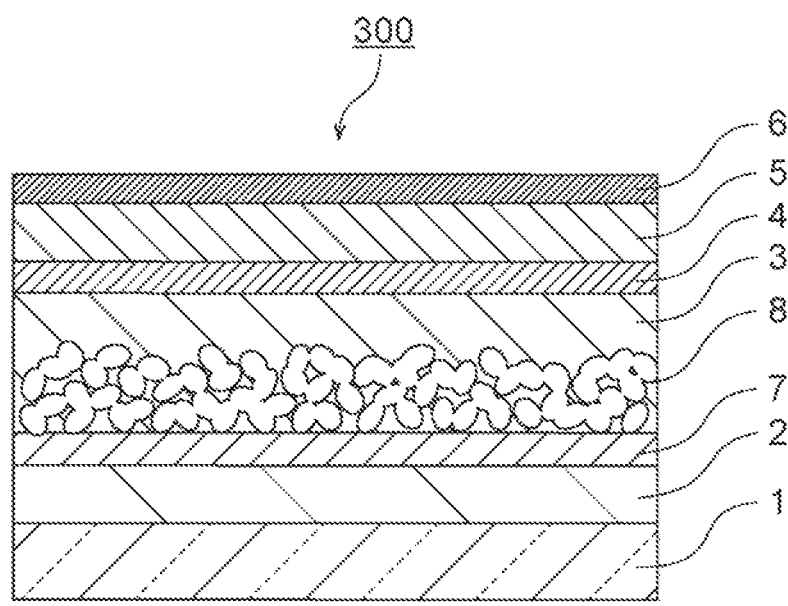
FIG. 3 shows a cross-sectional view of a modification example of the solar cell according to the first embodiment.

The perovskite solar cell according to the first embodiment may include a porous layer. FIG. 3 shows a cross-sectional view of a modification example of the solar cell according to the first embodiment.

The solar cell 300 shown in FIG. 3 includes a substrate 1, a first electrode 2, an electron transport layer 7, a porous layer 8, a photoelectric conversion layer 3, an intermediate layer 4, a hole transport layer 5, and a second electrode 6 in this order.

The solar cell 300 is produced by, for example, the following method.

Firstly, a first electrode 2 is formed on a surface of a substrate 1 by chemical vapor deposition (CVD), a sputtering method, or the like. Secondly, an electron transport layer 7 is formed on the first electrode 2 by a sputtering method or the like. A porous layer 8 is formed on the electron transport layer 7 by coating method or the like. Then a photoelectric conversion layer 3 is formed on the porous layer 8 by a coating method or the like. Subsequently, an intermediate layer 4 is formed on the photoelectric conversion layer 3 by a coating method or the like. A hole transport layer 5 is formed on the intermediate layer 4 by a coating method or the like. A second electrode 6 is formed on the hole transport layer 5 by CVD, a sputtering method, or the like to obtain a solar cell 300. Incidentally, the solar cell 100 can be produced by the same method as in the solar cell 300 except that the electron transport layer 7 and the porous layer 8 are not formed. The solar cell 200 can be produced by the same method as in the solar cell 300 except that the porous layer 8 is not formed.

Second Embodiment

A solar cell according to a second embodiment will now be described. Matters described in the first embodiment are omitted as appropriate.

The solar cell according to the second embodiment includes:
a first electrode; a photoelectric conversion layer; an intermediate layer; a hole transport layer; and a second electrode in this order, wherein
the hole transport layer includes a hole transport material and an oxidant,
the photoelectric conversion layer includes a perovskite compound containing iodine, and
an absolute value of a redox potential for neutralization of the cationized hole transport material is larger than an absolute value of a redox potential for neutralization of anions generated when the intermediate layer is ionized.

According to the configuration above, the solar cell according to the second embodiment has high light durability.

When the intermediate layer satisfies the configuration above, it is possible to prevent the hole transport material from being reduced by anions included in the intermediate layer.

The redox potential can be measured by, for example, inserting a standard electrode (e.g., platinum) and a reference electrode into an aqueous solution in which the material whose redox potential is to be determined is dissolved and reading the resulting potential difference.

When the intermediate layer includes, for example, $C_2H_5NH_3Br$, the anion that is generated when the intermediate layer is ionized is Br (i.e., a bromine anion). The redox potential for Br to become neutral, i.e., the redox potential when the reaction of the following expression (1) occurs, is about 5.7 eV. Incidentally, the redox potential is the value when the standard redox potential of hydrogen is defined as 4.6 eV.

$$Br^- \rightarrow Br + e^- \qquad (1).$$

Each component of the solar cell of the present disclosure will now be specifically described.

Substrate 1

The substrate 1 supports each layer of the solar cell. The substrate 1 can be formed from a transparent material. For example, a glass substrate or a plastic substrate (including plastic film) can be used. When the first electrode 2 has a sufficient strength, since the first electrode 2 can support each layer, the substrate 1 need not be provided.

First Electrode 2

The first electrode 2 has conductivity. In addition, the first electrode 2 can have translucency. For example, light from the visible region to the near-infrared region is permeable. The first electrode 2 can be constituted of, for example, a metal oxide that is transparent and has conductivity. Examples of such metal oxides are:
(i) an indium-tin composite oxide;
(ii) a tin oxide doped with antimony;
(iii) a tin oxide doped with fluorine;
(iv) a zinc oxide doped with at least one element selected from the group consisting of boron, aluminum, gallium, and indium; and
(v) a complex thereof.

The first electrode 2 may be formed using an opaque material and providing a pattern allowing light to pass through. Examples of the pattern allowing light to pass through are linear (stripe), wavy, and grid (i.e., mesh) patterns and a punch metal-like pattern in which a large number of fine through-holes are arranged regularly or irregularly. When the first electrode 2 has such a pattern, light can pass through the portion where the electrode material is not present. Examples of the opaque material are platinum, gold, silver, copper, aluminum, rhodium, indium, titanium, iron, nickel, tin, zinc, and an alloy including any thereof. A carbon material having conductivity may be used as the opaque material.

When the solar cell does not include the electron transport layer 7, the first electrode 2 has a blocking property against holes from the photoelectric conversion layer 3. In this case, the first electrode 2 is not in ohmic contact with the photoelectric conversion layer 3. Furthermore, the blocking property against holes from the photoelectric conversion layer 3 means a property of allowing only the electrons generated in the photoelectric conversion layer 3 to pass through and not allowing holes to pass through. The Fermi energy level of a material having such a property is higher than the energy level of the upper end of the conduction band of the photoelectric conversion layer 3. The Fermi energy level of the material having such a property may be higher than the Fermi energy level of the photoelectric conversion layer 3. Specific examples of the material include aluminum. Incidentally, aluminum does not have translucency. Accordingly, when a translucent electrode is formed using aluminum, for example, an electrode having a pattern shape mentioned above is adopted.

When the solar cell includes an electron transport layer 7 between the first electrode 2 and the photoelectric conversion layer 3, the first electrode 2 need not have a blocking property against holes from the photoelectric conversion layer 3. In this case, the first electrode 2 can be constituted of a material that can form ohmic contact with the photoelectric conversion layer 3. In this case, the first electrode 2 may be in ohmic contact with the photoelectric conversion layer 3 or not.

The first electrode 2 may have a light transmittance of, for example, 50% or more or 80% or more. The wavelength of light that should pass through the first electrode 2 depends on the absorption wavelength of the photoelectric conversion layer 3.

The first electrode 2 may have a thickness of, for example, 1 nm or more and 1000 nm or less.

Electron Transport Layer 7

The electron transport layer 7 includes a semiconductor. The electron transport layer 7 is desirably formed of a semiconductor having a band gap of 3.0 eV or more. Consequently, it is possible to transmit visible light and infrared light to the photoelectric conversion layer 3. Examples of the semiconductor are an organic n-type semiconductor and an inorganic n-type semiconductor.

Examples of the organic n-type semiconductor are an imide compound, a quinone compound, and a fullerene or fullerene derivative. Examples of the inorganic n-type semiconductor are a metal oxide and a perovskite oxide. Examples of the metal oxide are oxides of Cd, Zn, In, Pb, Mo, W, Sb, Bi, Cu, Hg, Ti, Ag, Mn, Fe, V, Sn, Zr, Sr, Ga, or Cr. The metal oxide is, for example, $TiO_2$. The perovskite oxide is, for example, $SrTiO_3$ or $CaTiO_3$.

The electron transport layer 7 may include a material having a band gap larger than 6 eV. Examples of the material having a band gap larger than 6 eV are:
(i) a halide of an alkali metal or alkaline-earth metal, such as lithium fluoride or calcium fluoride;
(ii) an oxide of an alkaline-earth metal, such as magnesium oxide; and
(iii) silicon dioxide.

In this case, the electron transport layer 7 may have a thickness of, for example, 10 nm or less for securing the electron transport property of the electron transport layer 7.

The electron transport layer 7 may include multiple layers of different materials.

Porous Layer 8

The porous layer 8 is disposed, for example, between the photoelectric conversion layer 3 and the electron transport layer 7. The porous layer 8 can become a foundation when the photoelectric conversion layer 3 is formed on the electron transport layer 7. The porous layer 8 does not inhibit the light absorption of the photoelectric conversion layer 3 and the electron transport from the photoelectric conversion layer 3 to the electron transport layer 7.

The porous layer 8 includes a porous material. The porous material includes a hole. The hole included in the porous layer 8 extends from a portion in contact with the electron transport layer 7 to a portion in contact with the photoelectric conversion layer 3. The hole is typically filled with a material constituting the photoelectric conversion layer 3, and electrons can directly move from the photoelectric conversion layer 3 to the electron transport layer 7.

The porous material is formed by, for example, a chain of insulation or semiconductor particles. Examples of the insulation particles are aluminum oxide particles and silicon oxide particles. Examples of the semiconductor particles are inorganic semiconductor particles. Examples of the inorganic semiconductor are a metal oxide, a perovskite oxide of a metal element, a sulfide of a metal element, and metal chalcogenide. Examples of the metal oxide are oxides of Cd, Zn, In, Pb, Mo, W, Sb, Bi, Cu, Hg, Ti, Ag, Mn, Fe, V, Sn, Zr, Sr, Ga, Si, and Cr. The metal oxide is, for example, $TiO_2$. Examples of the perovskite oxide of a metal element are $SrTiO_3$ and $CaTiO_3$. Examples of the sulfide of a metal element are CdS, ZnS, $In_2S_3$, PbS, MozS, $WS_2$, $Sb_2S_3$, $Bi_2S_3$, $ZnCdS_2$, and $Cu_2S$. Examples of the metal chalcogenide are CdSe, $In_2Se_3$, $WSe_2$, HgS, PbSe, and CdTe.

The thickness of the porous layer 8 may be 0.01 μm or more and 10 μm or less or 0.1 μm or more and 1 μm or less. The porous layer 8 may have a large surface roughness. Specifically, the surface roughness coefficient obtained by the value of (effective area)/(projected area) may be 10 or more or 100 or more. Incidentally, the projected area is the area of the shadow behind an object when the object is illuminated head on. The effective area is the actual surface area of the object. The effective area can be calculated from the volume determined from the projected area and thickness of the object and the specific surface area and bulk density of the material constituting the object.

The solar cell of the present disclosure need not include the porous layer 8.

Photoelectric Conversion Layer 3

The photoelectric conversion layer 3 includes a perovskite compound represented by a composition formula: $ABX_3$. "A" is a monovalent cation. Examples of the cation A are monovalent cations such as an alkali metal cation and an organic cation. Further specific examples include a methylammonium cation ($CH_3NH_3^+$), a formamidinium cation ($NH_2CHNH_2^+$), and a cesium cation ($Cs^+$). "B" is a divalent metal cation. Examples of the cation B are a Pb cation, a Sn cation, and a Ge cation. "X" is a monovalent anion and includes iodine. Examples of the anion X are halogen anions. The sites of the cation A, cation B, and anion X may be respectively occupied by multiple types of ions.

The thickness of the photoelectric conversion layer 3 varies depending on the intensity of the light absorption and is, for example, 100 nm or more and 2000 nm or less. The photoelectric conversion layer 3 can be formed by a solution-coating method or the like.

Intermediate Layer 4

The intermediate layer 4 functions as a layer preventing the diffusion of iodine anions from the photoelectric conversion layer 3 to the hole transport layer 5.

Bromine, chlorine, and fluorine have sufficiently high redox potentials and therefore do not inhibit oxidation of the hole transport material by an oxidant in the hole transport layer 5. As a result, the solar cell has high light durability.

For example, the change rate of the efficiency of the solar cell is desirably within 0.2%/h, i.e., −0.2%/h or more and 0.2%/h or less. Here, the change rate of the efficiency is the change rate of the photoelectric conversion efficiency per unit time when a solar cell is irradiated with artificial sunlight of 100 mW/cm².

In order to enhance the light durability of the solar cell, the intermediate layer 4 may include at least one selected from the group consisting of bromide, chloride, and fluoride as a main component. Here, the main component is a component included most in molar ratio. The intermediate layer 4 may consist essentially of at least one selected from the group consisting of bromide, chloride, and fluoride. Here, "the intermediate layer 4 consists essentially of at least one selected from the group consisting of bromide, chloride, and fluoride" means that the total content of bromide, chloride, and fluoride in the intermediate layer 4 is 90 mol % or more. The content may be 95 mol % or more. The intermediate layer 4 may consist of only at least one selected from the group consisting of bromide, chloride, and fluoride.

In order to enhance the light durability of the solar cell, the intermediate layer 4 may include bromide. The intermediate layer 4 may consist essentially of bromide. Here, "the intermediate layer 4 consists essentially of bromide" means that the intermediate layer 4 includes 90 mol % or more of bromide. The intermediate layer 4 may include 95 mol % or more of bromide. The intermediate layer 4 may consist of only bromide.

In order to enhance the light durability of the solar cell, the intermediate layer 4 may include a compound represented by a composition formula: $R-NH_4X$. Here, R is a hydrocarbon group, and X is at least one selected from the group consisting of bromine, chlorine, and fluorine. Examples of R are an alkyl group, a phenyl group, and a phenylalkyl group. X may include bromine.

R may be an alkyl group. That is, the bromide may be alkylammonium bromide. In order to sufficiently secure the performance of preventing diffusion of iodine anions, the number of carbon atoms of the alkylammonium bromide may be 4 or more.

In order not to inhibit charge injection, the thickness of the intermediate layer 4 may be 10 nm or less.

Hole Transport Layer 5

The hole transport layer 5 includes a hole transport material and an oxidant. The oxidant is added for increasing the concentration of holes.

The hole transport material may include a triphenylamine derivative.

Examples of the triphenylamine derivative are spiro-OMeTAD, a spiro-OMeTAD derivative, PTAA, and a PTAA derivative.

As the spiro-OMeTAD derivative, at least a part of hydrogen atoms or methoxy group of spiro-OMeTAD may be replaced by another functional group. For example, at least a part of the methoxy group of spiro-OMeTAD may be replaced by a hydrogen atom or a methyl group. Alternatively, at least a part of the hydrogen atoms of spiro-OMeTAD may be replaced by a methyl group or a methoxy group.

As the PTAA derivative, at least a part of hydrogen atoms or methyl group of PTAA may be replaced by another functional group. For example, at least a part of the methyl group of PTAA may be replaced by a hydrogen atom or a methoxy group. Alternatively, at least a part of the hydrogen atoms of PTAA may be replaced by a methyl group or a methoxy group.

The triphenylamine derivative may be PTAA or a PTAA derivative.

The hole transport layer 5 may include not only a triphenylamine derivative but also another hole transport material. Examples of the hole transport material are an organic substance and an inorganic semiconductor.

Examples of the organic substance to be used as the hole transport material are poly(3-hexylthiophene-2,5-diyl) (hereinafter, referred to as "P3HT") and poly(3,4-ethylenedioxythiophene) (hereinafter, referred to as "PEDOT"). In particular, the organic substance may be phenylamine having an electron level suitable for a perovskite solar cell. The molecular weight is not particular limited and may be a macromolecule.

Examples of the inorganic semiconductor to be used as the hole transport material are $Cu_2O$, $CuGaO_2$, CuSCN, CuI, CuPC, $NiO_x$, $MoO_x$, $V_2O_5$, and a carbon-based material such as graphene oxide.

The oxidant may be a fluoroboron-based compound. The fluoroboron-based compound has high stability and a redox potential suitable for oxidizing the hole transport material.

The fluoroboron-based compound is, for example, a boron compound having a pentafluorophenyl group. Examples of such a compound are TPFPB, 4-isopropyl-4'-methyldiphenyliodonium tetrakis(pentafluorophenyl) borate, and N,N-dimethylanilinium tetrakis(pentafluorophenyl) borate.

The fluoroboron-based compound may be TPFPB or a TPFPB derivative.

The oxidant may be tris(2-(1H-pyrazol-1-yl)-4-tert-butylpyridine) cobalt (III) tri[bis(trifluoromethane) sulfonimide] (i.e., FK209Co(III) TFSI salt).

The oxidant may be a salt including NO. Examples of the salt are $NO\text{-}TFSI$, $NO\text{-}BF_4$, $NO\text{-}PF_6$, and TEMPO-TFSI.

The oxidant may be 2,3,5,6-tetrafluoro-7,7,8,8-tetracyanoquinodimethane (i.e., F4-TCNQ).

The hole transport layer 5 may include multiple layers of different materials.

The thickness of the hole transport layer 5 may be 1 nm or more and 1000 nm or less or 10 nm or more and 500 nm or less from the viewpoint of low resistance.

Examples of the method for forming the hole transport layer 5 are a coating method and a printing method. Examples of the coating method are doctor blading, bar coating, spraying, dip coating, and spin coating. An example of the printing method is screen printing. The hole transport layer 5 may be formed by pressurizing or heat-treating a film obtained by mixing multiple materials. When the hole transport material is a low-molecular organic substance or inorganic semiconductor, the hole transport layer 5 may be formed by a vacuum evaporation method.

The hole transport layer 5 may include a supporting electrolyte and a solvent. The supporting electrolyte and the solvent have an effect of stabilizing the holes in the hole transport layer 5.

Examples of the supporting electrolyte are an ammonium salt and an alkali metal salt. Examples of the ammonium salt are tetrabutylammonium perchlorate, tetraethylammonium hexafluorophosphate, an imidazolium salt, and a pyridinium salt. Examples of the alkali metal salt are $LiN(SO_2CnF_{2n+1})_2$, $LiPF_6$, $LiBF_4$, lithium perchlorate, and potassium boron tetrafluoride.

The solvent included in the hole transport layer 5 may have a high ion conductivity. The solvent may be either an aqueous solvent or an organic solvent. From the viewpoint of stabilization of the solute, the solvent may be an organic solvent. Examples of the organic solvent are heterocyclic compounds, such as tert-butylpyridine (hereinafter, referred to as "tBP"), pyridine, and n-methylpyrrolidone.

As the solvent, an ionic liquid may be used alone or mixed with another solvent. The ionic liquid has low volatility and high flame resistance.

Examples of the ionic liquid are an imidazolium compound such as 1-ethyl-3-methylimidazolium tetracyanoborate, a pyridine compound, an alicyclic amine compound, an aliphatic amine compound, and an azonium amine compound.

Second Electrode 6

Since the solar cell of the present disclosure includes the hole transport layer 5, the second electrode 6 need not have a blocking property against electrons from the photoelectric conversion layer 3. That is, the material constituting the second electrode 6 may be a material that comes into ohmic contact with the photoelectric conversion layer 3.

The second electrode 6 has conductivity. In addition, the second electrode 6 can have translucency. The second electrode 6 is constituted as in the first electrode 2.

At least one electrode on the light incident side out of the first electrode 2 and the second electrode 6 has translucency. Accordingly, one of the first electrode 2 and the second electrode 6 need not have translucency. That is, one of the first electrode 2 and the second electrode 6 need not use a material having translucency and need not have a pattern including an opening portion that allows light to pass through.

EXAMPLES

The present disclosure will now be described in more detail with reference to examples.

The solar cell of Example 1 has the same structure as the solar cell 300 shown in FIG. 3. Each component is as follows:

Substrate 1: Glass Substrate;
First electrode 2: indium-doped $SnO_2$ layer (surface resistance: 10 Ω/sq., manufactured by GEOMATEC Co., Ltd.);
Electron transport layer 7: $TiO_2$ (thickness: 10 nm, manufactured by GEOMATEC Co., Ltd.);
Porous layer 8: $TiO_2$;
Photoelectric conversion layer 3: mainly including $CH(NH_2)\ PbI_3$;
Intermediate layer 4: $C_2H_5NH_3Br$;
Hole transport layer 5: including PTAA (manufactured by Sigma-Aldrich Co. LLC) as a hole transport material and TPFPB (manufactured by Tokyo Chemical Industry Co., Ltd.) as an additive; and
Second electrode 6: gold (thickness: 80 nm).

The solar cell of Example 1 was produced as follows.

As the substrate 1, the first electrode 2, and the electron transport layer 7, a conductive glass substrate (manufactured by Nippon Sheet Glass Co., Ltd.) having a thickness of 1 mm and provided with an indium-doped $SnO_2$ layer and a $TiO_2$ layer was used. A solution obtained by diluting titanium oxide nanoparticle paste (150 mg) (NR-D30, manufactured by GreatCell Solar Ltd.) with ethanol (1 mL) was applied onto the TiO₂ layer by spin coating, followed by heat-treatment at 500° C. for 30 minutes. Thus, a porous layer 8 was formed.

Subsequently, a solution including $PbI_2$ (0.92 M, manufactured by Tokyo Chemical Industry Co., Ltd.), $PbBr_2$ (0.17 M, manufactured by Tokyo Chemical Industry Co., Ltd.), FAI (0.83 M, manufactured by GreatCell Solar Ltd.), MABr (0.17 M, manufactured by GreatCell Solar Ltd.), CsI (0.05 M, manufactured by Iwatani Corporation), and RbI (0.05 M, manufactured by Iwatani Corporation) was prepared. The solvent of the solution was a mixture of dimethyl sulfoxide (DMSO, manufactured by Acros Organics) and N,N-dimethylformamide (DMF, manufactured by Acros Organics). The mixing ratio of DMSO and DMF in the solution was 1:4 as the volume ratio. This solution was spin-coated on the porous layer 8, followed by annealing on a hot plate of 100° C. for 45 minutes to form a photoelectric conversion layer 3.

Subsequently, an IPA (1 mL) (manufactured by Acros Organics) solution containing $C_2H_5NH_3Br$ (1 mg) (manufactured by GreatCell Solar Ltd.) was provided. This solution was spin-coated on the photoelectric conversion layer 3 to form an intermediate layer 4.

Subsequently, 1 mL of a toluene (manufactured by Acros Organics) solution containing PTAA (10 mg) and TPFPB (1.8 mg) was provided. This solution was spin-coated on the intermediate layer 4 to form a hole transport layer 5.

Lastly, gold (thickness: 80 nm) was evaporated on the hole transport layer 5 to form a second electrode 6.

Thus, a solar cell of Example 1 was obtained.

All steps described above were performed in a dry room having a dew point of −40° C. or less.

Example 2

A solar cell of Example 2 was obtained as in Example 1 except that the solute of the solution for producing the intermediate layer 4 was $C_3H_7NH_3Br$ (manufactured by GreatCell Solar Ltd.).

Example 3

A solar cell of Example 3 was obtained as in Example 1 except that the solute of the solution for producing the intermediate layer 4 was $C_4H_9NH_3Br$ (manufactured by GreatCell Solar Ltd.).

Example 4

A solar cell of Example 4 was obtained as in Example 1 except that the solute of the solution for producing the intermediate layer 4 was $C_8H_{17}NH_3Br$ (manufactured by GreatCell Solar Ltd.).

Comparative Example 1

A solar cell of Comparative Example 1 was obtained as in Example 1 except that the intermediate layer 4 was not formed and TPFPB was not added to the hole transport layer 5.

Comparative Example 2

The intermediate layer 4 was not formed, and the hole transport layer 5 was formed as follows. A toluene (manufactured by Acros Organics) solution (1 mL) including PTAA (10 mg), tBP (6 μL), and an acetonitrile solution (4.8 μL) containing LiTFSI dissolved at a concentration of 1.8 M were mixed to provide a solution. This solution was spin-coated on the intermediate layer 4 to form a hole transport layer 5.

A solar cell of Comparative Example 2 was obtained as in Example 1 except for the above matters.

Comparative Example 3

A solar cell of Comparative Example 3 was obtained as in Example 1 except that the intermediate layer 4 was not formed.

Comparative Example 4

A hole transport layer 5 was produced as follows. A toluene (manufactured by Acros Organics) solution (1 mL) including PTAA (10 mg), tBP (6 μL), and an acetonitrile solution (4.8 μL) containing LiTFSI dissolved at a concentration of 1.8 M were mixed to provide a solution. This solution was spin-coated on the intermediate layer 4 to form a hole transport layer 5.

A solar cell of Comparative Example 4 was obtained as in Example 3 except for the above matters.

Comparative Example 5

A solar cell of Comparative Example 5 was obtained as in Example 1 except that the solute of the solution for producing the intermediate layer 4 was $C_4H_9NH_3I$ (manufactured by GreatCell Solar Ltd.).

Evaluation of Solar Cell Characteristics

Characteristics of the solar cells of Examples 1 to 4 and Comparative Examples 1 to 5 were evaluated under artificial sunlight by setting a solar simulator (ALS440B, manufactured by BAS Inc.) to an output of 100 mW/cm². Output current values for applied voltages that were changed from 1.2 V to 0 V were recorded, and the conversion efficiency was calculated. The initial efficiencies of the solar cells of Examples 1 to 4 and Comparative Examples 1 to 5 are shown in Table 2.

Change Rate of Efficiency

The solar cells of Examples 1 to 4 and Comparative Examples 1 to 5 were subjected to a light irradiation test. A resistance was connected to a solar cell such that the solar cell device was operated at near its optimum operating point under artificial sunlight of 100 mW/cm², and the output was recorded with a data logger. The change rate of the photoelectric conversion efficiency per unit time was calculated by [(photoelectric conversion efficiency after light irradiation test)−(photoelectric conversion efficiency before light irradiation test)]/(photoelectric conversion efficiency before light irradiation test)/(testing time)×100 (%/h). The change rates of the photoelectric conversion efficiency of the solar cells of Examples 1 to 4 and Comparative Examples 1 to 5 are shown in Table 2.

TABLE 2

| | Intermediate layer | Additive | Initial efficiency (%) | Efficiency change rate (%/h) |
|---|---|---|---|---|
| Example 1 | $C_2H_5NH_3Br$ | TPFPB | 16.9 | −0.15 |
| Example 2 | $C_3H_7NH_3Br$ | TPFPB | 16.7 | −0.07 |
| Example 3 | $C_4H_9NH_3Br$ | TPFPB | 15.9 | +0.075 |
| Example 4 | $C_8H_{17}NH_3Br$ | TPFPB | 15.1 | +0.116 |

TABLE 2-continued

| | Intermediate layer | Additive | Initial efficiency (%) | Efficiency change rate (%/h) |
|---|---|---|---|---|
| Comparative Example 1 | None | None | 11.4 | −5.42 |
| Comparative Example 2 | None | LiTFSI + tBP | 17.2 | −5.05 |
| Comparative Example 3 | None | TPFPB | 16.8 | −1.40 |
| Comparative Example 4 | $C_4H_9NH_3Br$ | LiTFSI + tBP | 17.6 | −0.35 |
| Comparative Example 5 | $C_4H_9NH_3I$ | TPFPB | 16.1 | −0.49 |

It is inferred that the change rate of efficiency is desirable within 2% for stable operation of a solar cell. Although the stability time required by industry standards varies depending on the type of the solar cell, as a guideline, the maximum driving time of a solar cell per day is about 10 hours. Accordingly, it is desirable that the change rate of efficiency per hour is within 0.2%/h, that is, the value calculated by the above-mentioned expression for determining the change rate of the photoelectric conversion efficiency per unit time is −0.2%/h or more and 0.2%/h or less. It is demonstrated that in the solar cells of Examples 1 to 4, the reduction in the photoelectric conversion efficiency per unit time is suppressed within 0.2%/h, by comparing with the solar cells of Comparative Examples 1 to 5. Accordingly, a solar cell including an intermediate layer containing at least one selected from the group consisting of bromide, chloride, and fluoride and a hole transport layer containing a fluoroboron-based compound as an additive has excellent light durability. As obvious from the results of the solar cells of Examples 3 and 4, when the number of carbon atoms of the bromide included in the intermediate layer is 4 or more, no reduction in the photoelectric conversion efficiency per unit time was observed. Accordingly, when the number of carbon atoms of the bromide included in the intermediate layer is 4 or more, the solar cell has more excellent light durability.

Evaluation of Change Rate of Iodine Anion

The change rate of iodine anions between before and after the light irradiation test of each of the solar cells of Example 3 and Comparative Example 3 was measured using hard X-ray photoelectron spectroscopy (HAXPES).

The peak integrated intensity ($I^0$) of zerovalent iodine and the peak integrated intensity ($I^-$) of monovalent iodine (i.e., iodine anion) near the surface of the solar cell from which the second electrode 6 was removed were measured.

The proportion of the zerovalent iodine was calculated by $I^0/(I^0+I^-)\times 100$.

The change rate of iodine anion was calculated by [(proportion of zerovalent iodine after light irradiation test)−(proportion of zerovalent iodine before light irradiation test)]/(proportion of zerovalent iodine before light irradiation test)×100(%).

The change rate of iodine anion of the solar cell of Example 3 was −1.9%. The change rate of iodine anion of the solar cell of Comparative Example 3 was +9.6%. Accordingly, it is demonstrated that in a solar cell including an intermediate layer containing bromide and a hole transport layer containing a fluoroboron-based compound as an additive, the amount of change from iodine anion to zerovalent iodine is small, compared with a solar cell including the hole transport layer containing a fluoroboron-based compound as an additive but not including the intermediate layer. From the above results, it is inferred that in a solar cell including an intermediate layer containing bromide and a hole transport layer containing a fluoroboron-based compound as an additive, the hole transport material is prevented from being reduced by iodine anions. Thus, it was confirmed that the redox reaction in the hole transport layer works as designed to improve the light durability.

The solar cell of the present disclosure can be used in various applications including applications of known solar cells.

What is claimed is:

1. A solar cell comprising a first electrode, a photoelectric conversion layer, an intermediate layer, a hole transport layer, and a second electrode in this order, wherein,
    the hole transport layer includes a hole transport material and an oxidant,
    the photoelectric conversion layer includes a perovskite compound containing iodine, and
    the intermediate layer includes at least one selected from the group consisting of bromide, chloride, and fluoride.

2. The solar cell according to claim 1, wherein the hole transport material includes a triphenylamine derivative.

3. The solar cell according to claim 2, wherein the triphenylamine derivative is poly[bis(4-phenyl) (2,4,6-trimethylphenyl)amine] or a poly[bis(4-phenyl) (2,4,6-trimethylphenyl)amine] derivative.

4. The solar cell according to claim 1, wherein the oxidant is a fluoroboron-based compound.

5. The solar cell according to claim 4, wherein the fluoroboron-based compound is tris(pentafluorophenyl) boran or a tris(pentafluorophenyl) boran derivative.

6. The solar cell according to claim 1, wherein the intermediate layer includes bromide.

7. The solar cell according to claim 6, wherein the bromide is alkylammonium bromide.

8. The solar cell according to claim 7, wherein the alkylammonium bromide has four or more carbon atoms.

9. The solar cell according to claim 7, wherein the hole transport material is poly[bis(4-phenyl) (2,4,6-trimethylphenyl)amine] or a poly[bis(4-phenyl) (2,4,6-trimethylphenyl)amine] derivative, and the oxidant is tris(pentafluorophenyl) boran or a tris(pentafluorophenyl) boran derivative.

10. A solar cell comprising a first electrode, a photoelectric conversion layer, an intermediate layer, a hole transport layer, and a second electrode in this order, wherein,
    the hole transport layer includes a hole transport material and an oxidant,
    the photoelectric conversion layer includes a perovskite compound containing iodine, and
    an absolute value of a redox potential for neutralization of the cationized hole transport material is larger than an absolute value of a redox potential for neutralization of anions generated when the intermediate layer is ionized.

* * * * *